United States Patent
Sasagawa et al.

(10) Patent No.: US 7,485,579 B2
(45) Date of Patent: Feb. 3, 2009

(54) METHOD OF MANUFACTURING A SEMICONDUCTOR DEVICE

(75) Inventors: Shinya Sasagawa, Kanagawa (JP); Takashi Yokoshima, Kanagawa (JP); Shigeharu Monoe, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 634 days.

(21) Appl. No.: 10/731,089

(22) Filed: Dec. 10, 2003

(65) Prior Publication Data

US 2005/0181610 A1  Aug. 18, 2005

(30) Foreign Application Priority Data

Dec. 13, 2002  (JP) ............... 2002-361924

(51) Int. Cl.
*H01L 21/302* (2006.01)
(52) U.S. Cl. ............ 438/689; 438/592; 438/595; 438/696; 438/701; 438/712; 438/733; 216/37; 216/58; 216/67; 430/313; 430/317
(58) Field of Classification Search ........... 216/37, 216/58; 430/313, 317; 438/592, 595
See application file for complete search history.

(56) References Cited

U.S. PATENT DOCUMENTS

| | | | |
|---|---|---|---|
| 4,707,721 A | 11/1987 | Ang et al. | |
| 4,963,504 A | 10/1990 | Huang | |
| 5,177,577 A | 1/1993 | Taniguchi et al. | |
| 5,445,710 A * | 8/1995 | Hori et al. | 438/717 |
| 5,498,573 A | 3/1996 | Whetten | |
| 5,583,067 A | 12/1996 | Sanchez | |
| 6,201,281 B1 | 3/2001 | Miyazaku et al. | |

(Continued)

FOREIGN PATENT DOCUMENTS

EP  1 128 430 A2  8/2001

(Continued)

OTHER PUBLICATIONS

Y. Mishima et al.; "Improved Lifetime of Poly-Si TFTs With a Self-Aligned Gate-Overlapped LDD Structure"; IEEE Transactions on Electron Devices; Jun. 1, 2002; vol. 49; No. 6; pp. 981-985.

(Continued)

*Primary Examiner*—Lan Vinh
*Assistant Examiner*—Maki Angadi
(74) *Attorney, Agent, or Firm*—Nixon Peabody LLP; Jeffrey L. Costellia (57) ABSTRACT

In performing an anisotropic etching process after a taper etching process of a gate conductive layer of a two-layer or three-layer laminated structure, a portion that is not etched is left at an edge of a second conductive film to shorten an LDD region. It is an object to make the LDD region longer by reducing or removing the left portion that is not etched. After a taper etching process of a gate conductive layer of a two-layer or three-layer laminated structure, an argon plasma treatment is performed. With this argon plasma treatment, a reactive organism in the taper etching process is removed, and it becomes possible to reduce or remove the left portion that is not etched in the anisotropic etching to be performed next.

27 Claims, 10 Drawing Sheets

U.S. PATENT DOCUMENTS

| | | |
|---|---|---|
| 6,235,558 B1 | 5/2001 | Oda et al. |
| 6,300,196 B1 * | 10/2001 | Chang ..................... 438/257 |
| 6,501,098 B2 | 12/2002 | Yamazaki |
| 6,545,359 B1 | 4/2003 | Ohtani et al. |
| 6,596,571 B2 | 7/2003 | Arao et al. |
| 6,646,287 B1 | 11/2003 | Ono et al. |
| 6,706,544 B2 | 3/2004 | Yamazaki et al. |
| 6,809,021 B2 | 10/2004 | Ohtani et al. |
| 6,872,604 B2 | 3/2005 | Yamazaki et al. |
| 6,909,114 B1 | 6/2005 | Yamazaki |
| 6,933,184 B2 | 8/2005 | Arao et al. |
| 7,064,020 B2 | 6/2006 | Yamazaki |
| 2001/0030322 A1 | 10/2001 | Yamazaki et al. |
| 2001/0035526 A1 | 11/2001 | Yamazaki et al. |
| 2001/0041392 A1 | 11/2001 | Suzawa et al. |
| 2001/0048408 A1 | 12/2001 | Koyama et al. |
| 2001/0052950 A1 | 12/2001 | Yamazaki et al. |
| 2001/0055841 A1 | 12/2001 | Yamazaki et al. |
| 2002/0000551 A1 | 1/2002 | Yamazaki et al. |
| 2002/0048829 A1 | 4/2002 | Yamazaki et al. |
| 2002/0102776 A1 | 8/2002 | Yamazaki et al. |
| 2002/0163049 A1 | 11/2002 | Yamazaki et al. |
| 2003/0020118 A1 | 1/2003 | Kajiwara et al. |
| 2003/0054653 A1 | 3/2003 | Yamazaki et al. |
| 2003/0062524 A1 | 4/2003 | Kimura |
| 2003/0100151 A1 | 5/2003 | Okamoto |
| 2004/0023478 A1 * | 2/2004 | Samavedam et al. ........ 438/592 |
| 2004/0087125 A1 | 5/2004 | Monoe |
| 2004/0140472 A1 | 7/2004 | Fujimoto et al. |
| 2004/0171242 A1 | 9/2004 | Monoe et al. |
| 2004/0209409 A1 | 10/2004 | Monoe et al. |
| 2005/0056837 A1 | 3/2005 | Ohtani et al. |
| 2005/0056934 A1 | 3/2005 | Suzawa et al. |
| 2005/0104068 A1 | 5/2005 | Yamazaki |
| 2005/0110016 A1 | 5/2005 | Yamazaki |
| 2005/0266593 A1 | 12/2005 | Suzawa et al. |
| 2006/0051906 A1 | 3/2006 | Yamazaki |
| 2006/0208258 A1 | 9/2006 | Yamazaki |

FOREIGN PATENT DOCUMENTS

| | | |
|---|---|---|
| JP | 06-53324 | 2/1994 |
| JP | 10-12605 | 1/1998 |
| JP | 2000-269331 | 9/2000 |
| JP | 2000-294787 | 10/2000 |
| JP | 2001-313397 | 11/2001 |
| JP | 2002-14337 | 1/2002 |
| JP | 2003-257950 | 9/2003 |

OTHER PUBLICATIONS

K. Ohgata et al.; "A New Dopant Activation Technique for Poly-Si TFTs With a Self-Aligned Gate-Overlapped LDD Structure"; IEDM: Technical Digest of International Devices Meeting; Dec. 10, 2000; pp. 205-208.

U.S. Appl. No. 10/731,000, filed Dec. 10, 2003.

U.S. Appl. No. 10/777,117, filed Feb. 13, 2004.

M. Wittmer et al., "Characteristics of TIN gate metal-oxide-semiconductor field effect transistors", J. Appl. Phys. vol. 54, No. 3, Mar. 1983, pp. 1423-1428.

* cited by examiner

Resist

TiN

Ti

TaN

FIG. 8

Resist
TiN
Ti
TaN

METHOD OF MANUFACTURING A SEMICONDUCTOR DEVICE

DETAILED DESCRIPTION OF THE INVENTION

1. Technical Field to Which the Invention Belongs

The present invention relates to a method of manufacturing an insulated gate field-effect transistor. In particular, the present invention relates to a method of manufacturing a semiconductor device, which can be applied to a thin film transistor (TFT) with a gate overlapping structure.

2. Prior Art

In a display device using a liquid crystal, a product with a large-screen over 20 inches, which is typified by a liquid crystal display TV, has been put to practical use. In recent years, a liquid crystal display device integrated with a driving circuit has been realized with a TFT in which a polycrystalline silicon film is used as an active layer.

However, a defect is pointed out that a TFT using a polycrystalline silicon film has a low withstanding pressure in drain junction to increase junction leak current (hereinafter, referred to as OFF-leak current). It is known that it is effective to form a lightly doped region (LDD) structure as measures for the defect.

The phenomenon is pointed out as a problem that high electric field is generated in the vicinity of the drain region, then, a generated hot carrier is trapped by a gate insulating film on the LDD region, and then, device characteristics such as threshold voltage are greatly fluctuated and lowered. In order to prevent the deterioration due to hot carriers, a TFT in which a gate electrode is overlapped with an LDD region is disclosed (refer to Japanese Patent Laid-Open 2000-294787). The TFT with the gate overlapped LDD structure has higher current driving ability compared to a TFT with a normal LDD structure, and effectively eases the high electric field in the vicinity of the drain region to suppress the deterioration due to hot carriers.

However, in the case of the TFT with the gate overlapped LDD structure disclosed in the above publication, after an impurity region for forming an LDD region is formed in a semiconductor layer, a gate electrode is overlapped with the LDD region. Accordingly, the portion overlapping with the gate electrode cannot be accurately formed along with the miniaturization of design rule.

As an appropriate example for manufacturing a TFT with a gate overlapping LDD structure in a self-aligning manner, the technique is disclosed that a conductive layer that has at least two layer laminated is subjected to exposure once and etching plural times to make the upper layer and the lower layer have different sizes, and then, ion doping is conducted with utilizing the differences in size and thickness to form an LDD region overlapped with a gate electrode in a self-aligning manner (for example, refer to Japanese Patent Laid-Open 2002-14337).

Of course, it is necessary that a length of the LDD (a length with respect to the is channel length) is optimized depending on driving voltage of the TFT in order to maximally show the function of the LDD overlapped with the gate electrode as measures against the deterioration due to hot carriers. Namely, there is an optimum length for easing effectively the high electric field in the vicinity of the drain region.

PROBLEM TO BE SOLVED BY THE INVENTION

The technique disclosed in the above-mentioned publication has two steps: the first step of etching a conductive layer that has two layers laminated into a tapered shape and the second step of selectively subjecting only the upper layer of the conductive layer in the tapered shape to anisotropic etching, and is characterized in that a taper angle is controlled to enable controlling the length of the LDD.

In order to drive a TFT with a channel length on the order of 10 µm at 10 to 20 V, the TFT needs to have an LDD with a length (a length of a portion overlapping with a gate electrode) at least 1 µm (preferably, at least 1.5 µm).

In the conventional technique using a gate electrode that has a laminated structure of at least two layers, it is necessary that a taper angle (an angle with the substrate surface) of an edge be decreased in the stage of processing the gate electrode in order to control a length of an LDD. For that purpose, the mask pattern needs to be largely recessed.

However, in the case of forming a gate electrode in which a first conductive layer of a two-layer laminated structure is tantalum nitride and the second conductive layer is titanium or metal including titanium as its main component, it is difficult to obtain a tapered shape that is necessary for getting the length of the LDD region at 1 µm or more, preferably, 1.5 µm by a taper etching process, that is, an increase of a taper angle of an edge of the conductive film becomes a problem. If an anisotropic etching process is conducted thereafter, a portion that is not etched (a skirt shape) is left at an edge of the second conductive layer to shorten a portion that functions as the LDD region. Also in the case of a three-layer laminated structure, a portion that is not etched (a skirt shape) is left as above to cause the same problem.

For not only the gate electrode but also an edge portion or a sidewall portion of a film, it makes an etching process into a tapered-shape in accordance with a mask pattern possible that dry etching is used to etch the object to be processed while recessing a width of the mask pattern at the same time. For that purpose, the selection of a kind of gas for etching, the regulation of bias voltage, and the selective ratio of the film to a material of the mask pattern are important matters.

Since the portion that is not etched is left at the edge of the second conductive layer in the anisotropic etching process after the taper etching process of the gate conductive layers of the two-layer or the three-layer laminated structure, with the result that the LDD region is shortened, it is an object of the present invention to reduce or remove the left portion that is not etched at the edge of the second conductive layer to get a necessary length as the LDD region.

MEANS FOR SOLVING THE PROBLEM

Since a sufficient taper cannot be obtained in a taper etching process, it is necessary to remove the left portion that is not etched at the edge of the second conductive layer (skirt shape) in order to make the LDD region longer as much as possible. According to the present invention, an argon plasma treatment is added between a taper etching process and an isotropic etching process to be performed to two-layer or three-layer laminated conductive layers to serve as reducing or removing a left portion that is not etched (skirt shape), which is generated at an edge of the second conductive layer by the isotropic etching process thereafter.

The length of an LDD overlapping with a gate electrode (hereinafter, referred to as Lov for the sake of convenience), which is necessary for controlling degradation due to hot carriers, is considered as follows.

Figure 9:
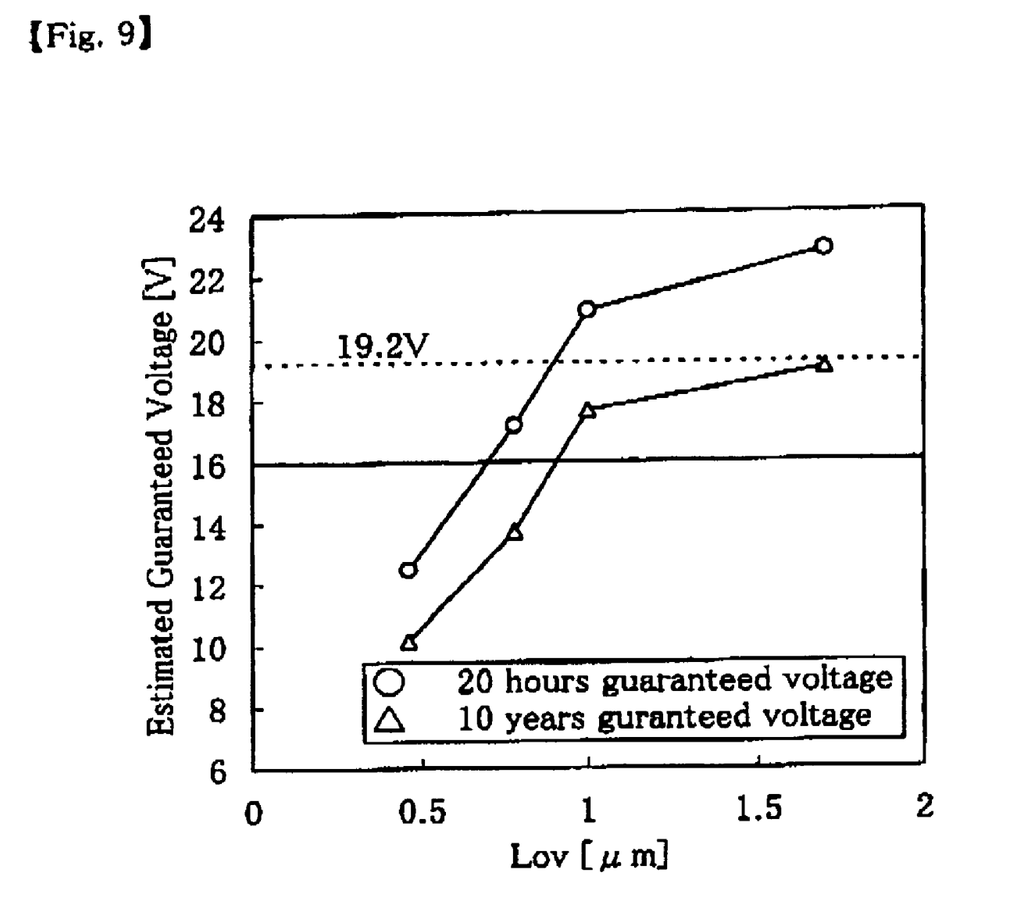
[FIG. 9] a graph showing a dependency of an estimated guaranteed voltage (10% deterioration of ON-state current) on a length of Lov.
Figure 10:
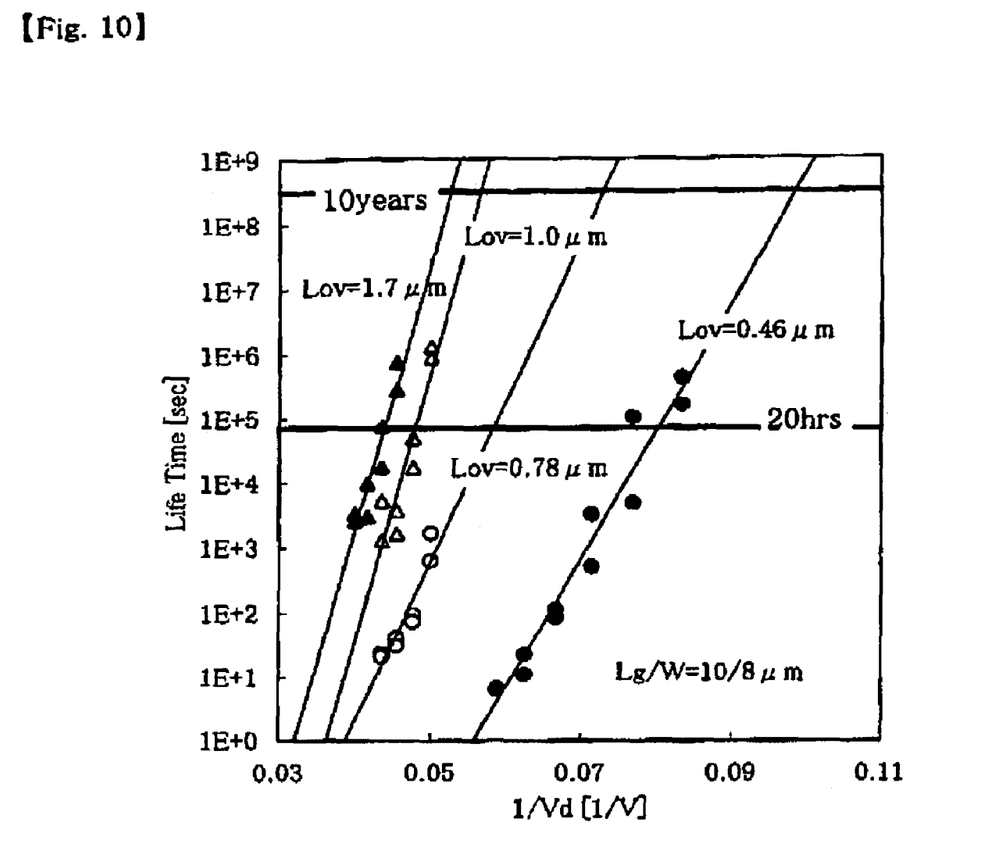
[FIG. 10] a characteristic diagram for estimating a lifetime of a TFT in accordance with a bias stress test and a graph showing a dependency on Lov.

First, the time until decrease of the maximum field-effect mobility by 10% is defined as lifetime in the case where the Lov is a predetermined value to degradation of a TFT, and the voltage at which the lifetime becomes ten years is derived as ten-year guaranteed voltage from a linear relationship obtained by plotting the reciprocal of a drain voltage on a semilogarithmic graph, as shown in FIG. 10. For example, in FIG. 10, the ten-year guaranteed voltage of a TFT with a Lov of 1.0 μm is 16 V. A high-voltage power source often has 16V in a liquid crystal panel and it is required to obtain guaranteed voltage of 19.2 V or more, which has a margin of twenty percent. FIG. 9 is a graph in which thus obtained value of the estimated guaranteed voltage is plotted in the case where Lov has each of 0.5 μm, 0.78 μm, 1.0 μm, 1.5 μm, and 1.7 μm. FIG. 9 also shows a value of drain voltage as twenty-hour guaranteed voltage, at which the time until change in ON-state current of the TFT by 10% is 20 hours in a bias stress test.

Although degradation due to hot carrier effect is insignificant with low driving voltage, it becomes difficult to be negligible in the case of driving at 10 V or more. As is clear from FIG. 9, it is necessary to make the Lov 1 μm or more, preferably, 1.5 μm or more in the case of the driving voltage of 16 V.

In order to satisfy the above requirement, the present invention provides a method for manufacturing a semiconductor device, which forms an LDD overlapping with a gate electrode in a self-aligning manner, wherein a gate electrode is formed of a laminate that has a plurality of conductive layers, which is made into a shape in which a width of a lower first conductive layer is longer in the direction of a channel length than that of a second conductive layer, and the gate electrode is used as a mask during ion doping for forming the LDD. At this time, in order to make the LDD overlapping with the gate electrode 1 μm or more, and preferably, 1.5 μm or more, the present invention is characterized in that a shape of a mask pattern for forming the gate electrode is processed, and dry etching is combined to obtain an optimum shape.

The present invention has a process of performing a first etching process for forming a first conductive layer pattern in which a sidewall portion of a laminate is tapered after a forming mask pattern on a laminate of metal nitride and one of titanium and metal including titanium as its main component, and a process of performing a second etching process for performing an isotropic etching to the first conductive layer pattern, wherein a plasma treatment with inert gas is performed between the first etching process and the second etching process.

In the present invention, a laminated structure comprising a lower first conductive layer and an upper second conductive layer is formed over a semiconductor layer with a gate insulating film interposed therebetween, a mask pattern is formed on the laminated structure, argon plasma is irradiated after performing taper etching to the second conductive layer and the first conductive layer, and the second conductive layer in a first conductive layer pattern is selectively etched in accordance with the mask pattern to form a second conductive layer pattern in which a width of the first conductive layer in the direction of a channel length is different from that of the second conductive layer and is longer. It becomes possible to make a projecting length of the first conductive layer 1 μm or more, which is used as a mask for shielding ions accelerated by an electric field to enable forming a lightly doped drain region overlapping with the first conductive layer pattern. In other words, the lightly doped drain region can be formed in a self-aligning manner. Of course, the second conductive layer pattern can be used as a gate electrode.

In the invention as above, an appropriate combination of the first conductive layer and second conductive layer is that the first conductive layer is tantalum nitride and the second conductive layer is titanium or one of an alloy and a compound including titanium as its main component.

In the present invention, a first conductive layer, a second conductive layer, and a third conductive layer are sequentially laminated over a semiconductor layer with a gate insulating film interposed therebetween to form a laminated structure, a mask pattern is formed thereon and a first conductive layer pattern that has tapered portions at respective edges is formed, argon plasma is irradiated after this taper etching process, and the third conductive layer and the second conductive layer in the first conductive layer pattern are selectively etched in accordance with the mask pattern to form a second conductive layer pattern in which a width of the first conductive layer in the direction of a channel length is different from that of the second conductive layer and is longer. It becomes possible to make a projecting length of the first conductive layer 1 μm or more, which is used as a mask for shielding ions accelerated by an electric field to enable forming a lightly doped drain region overlapping with the first conductive layer pattern. In other words, the lightly doped drain region can be formed in a self-aligning manner. Of course, the second conductive layer pattern can be used as a gate electrode.

In the invention above, an appropriate combination of the first conductive layer, the second conductive layer, and third conductive layers is that the first conductive layer is tantalum nitride, the second conductive layer is titanium or one of an alloy and a compound including titanium as its main component, and the third conductive layer is titanium nitride.

EMBODIMENT MODE OF THE INVENTION

Hereinafter, an embodiment mode of the present invention will be described in detail with reference to drawings. It should be understood that the invention is not limited to the following embodiment mode and that various modifications are permitted without departing from the spirit and scope thereof.

Embodiment Mode 1

In the present mode embodiment, a process will be described, where a gate electrode is used as a mask during ion doping to form an LDD overlapping with the gate electrode in a self-aligning manner and make the length (Lov) 1 μm or more. More specifically, an argon plasma treatment is performed to a conductive layer of a taper sidewall portion of a tapered laminated structure after forming a first conductive layer pattern, and a second conductive layer pattern in a first conductive layer pattern is selectively etched in accordance with the mask pattern to form a second conductive layer pattern.

Figure 1:
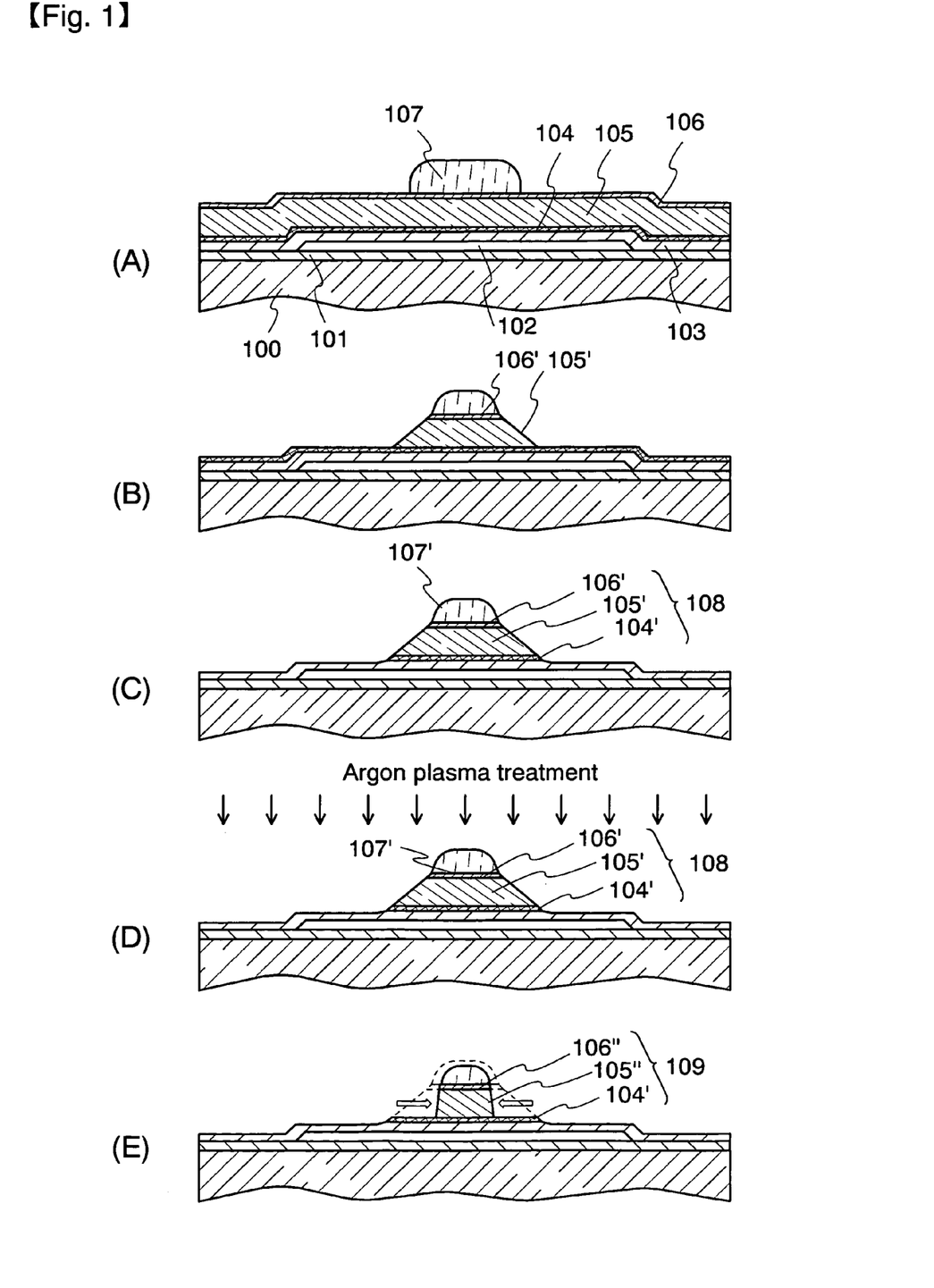
[FIG. 1] sectional views for describing a process for making a semiconductor device according to the present invention.

In FIG. 1(A), a first insulating film (base film) 101, a semiconductor layer 102, and a second insulating film (gate insulating film) 103 are formed on a glass substrate 100, and a first conductive layer 104, a second conductive layer 105, and a third conductive layer 106 are formed thereon. A mask pattern 107 is formed with the use of a photoresist according to photolithographic processing.

As the first conductive layer, a metal having high-melting point such as tantalum nitride (TaN) is formed to be a thickness from 30 to 50 nm, and the second conductive layer is formed of titanium or one of an alloy or a compound including titanium as its main component to be a thickness from 300 to 600 nm.

For the third conductive layer, a metal having high-melting point such as titanium nitride (TiN) is used. However, the third conductive layer is provided to lower contact resistance and is not the essential component required in the present invention. It makes processing easy to combine the second conductive layer of titanium or one of alloy or a compound including titanium as its main component since titanium nitride can be processed with the same etching gas as that for titanium.

Next, as shown in FIG. 1(B), the second conductive layer 105 and the third conductive layer 106 are etched dry etching. As etching gas, gas of $CF_4$, $Cl_2$, and $O_2$ is used. To increase an etching rate, a dry etching system that uses a high-density plasma source such as ECR (Electron Cyclotron Resonance) or ICP (Inductively Coupled Plasma) is used.

Figure 3:
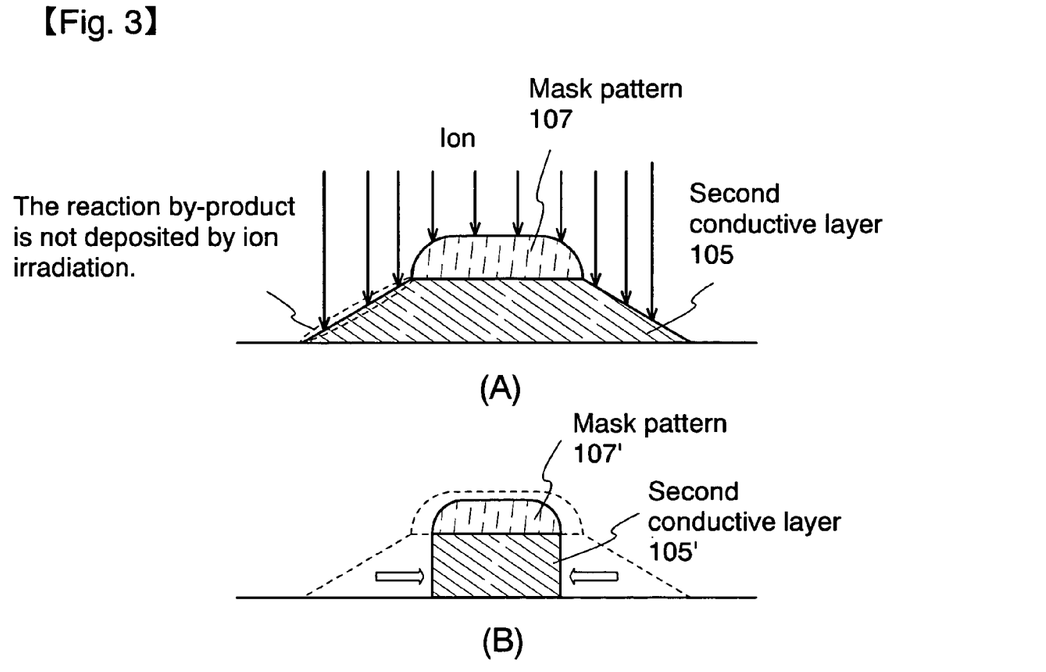
[FIG. 3] diagrams for describing an effect of removing a reaction by-product by taper etching.
Figure 4:
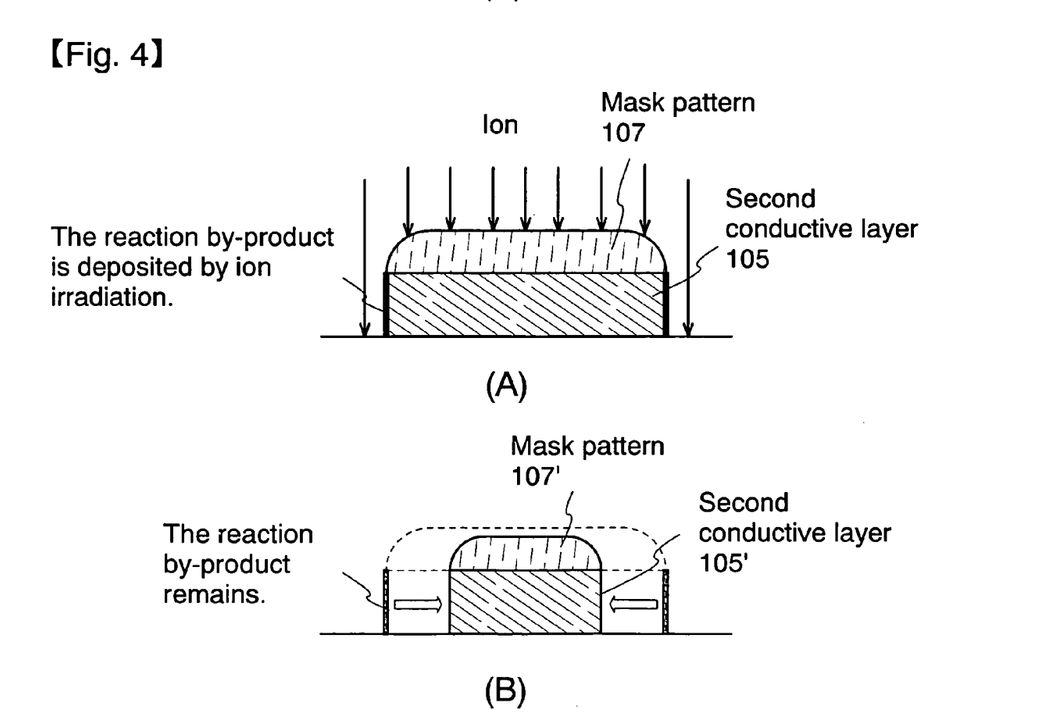
[FIG. 4] diagrams for describing an effect of a reaction by-product in the case where the taper etching is not performed.

The mask pattern 107 formed of resist is sputtered by ions accelerated by an electric field, and a reaction by-product adheres to the sidewall of the workpiece. This is also called a sidewall protective film, and the reason why the second conductive layer including titanium as its main component is tapered in the process at this stage is to remove the sidewall protective film. Namely, since the reaction by-product is hardly deposited on the sidewall when anisotropic etching is thereafter performed to a tapered second conductive layer 105 as shown in FIG. 3(A), it is possible to perform the etching process without leaving residue to form patterns of the second and third conductive layers 105' and 106' as shown in FIG. 3(B). On the other hand, when the sidewall of the second conductive layer 105 is substantially vertical as shown in FIG. 4(A), a reaction by-product is deposited during the etching process, and the reaction by-product remains when an anisotropic etching is performed thereafter, as shown in FIG. 4(B). In other words, when at least the second conductive layer is tapered at this stage, the sidewall protective film can be removed.

Next, the etching gas is changed to $CF_4$ and $Cl_2$ to etch tantalum nitride that is the first conductive layer. Of course, all of the conductive layers may be etched at the same time. However, it is necessary to set longer etching time in consideration of fluctuation in etching rate in etching the second conductive layers 105 with the thick film thickness. In that case, a base is etched to become extremely thin when the base is silicon oxide. In order to prevent this, two steps of etching processes are performed in this way.

In this way, a first conductive layer pattern 108 comprising first conductive layer 104', second conductive layer 105', and third conductive layer 106' is formed on the second insulating film 103, as shown in FIG. 1(C). The angle made by the tapered shape at the edge and a surface of the substrate 100 is made 10 to 20 degrees. Although the angle is determined depending mainly on the relations with the film thickness of the second conductive layer, the length occupied by the tapered portion is made about 0.5 to 1.5 μm.

After the taper process of the respective conductive films, an argon plasma treatment is performed to remove a reaction product adhering to the taper sidewall. When this argon plasma treatment is not performed, the reaction product becomes a stopper later in trying a process under anisotropic etching conditions to leave a portion that is not etched (skirt shape) at an edge of the second conductive layer, and it is hard to form at an intended shape, which is near to perpendicularity as mush as possible. The argon plasma treatment after the taper process is necessary for preventing the portion that is not etched from being left at the edge of the second conductive layer. (FIG. 1(D))

Then, with the use of $BCl_3$, $Cl_2$, and $O_2$ as etching gas, the second conductive layer 105' and the third conductive layer 106' are selectively etched in accordance with a mask pattern 107'. In this case, the bias voltage to be applied to the substrate side is lowered to thereby leave the first conductive layer 104'. The edge of the second conductive layer 105' is recessed inward from that of the first conductive layer 104', and the length of Lov is determined depending on the recess amount, as will be described later. In this manner, a second conductive layer pattern 109 comprising the first conductive layer 104', a second conductive layer 105", and the third conductive layer 106" are formed, which becomes a gate electrode at a portion intersecting with the semiconductor layer 102 (FIG. 1(E)).

Figure 2:
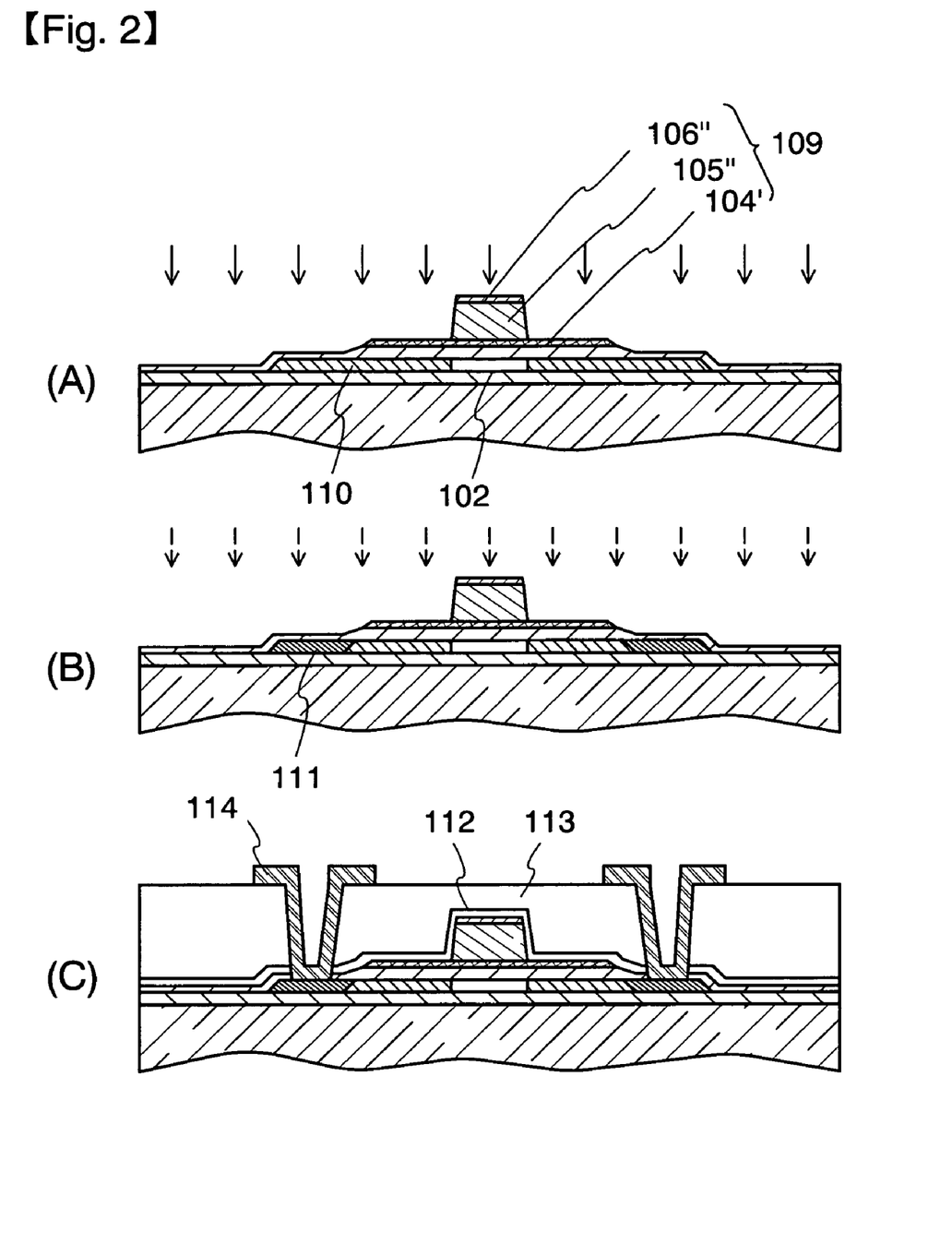
[FIG. 2] sectional views for describing a process for making the semiconductor device according to the present invention.

The addition of an impurity with one conductivity type to the semiconductor film 103, that is, the formation of an LDD and a source/drain region can be performed in a self-aligning manner with the use of the second conductive layer pattern 109. FIG. 2(A) shows a doping process for forming an LDD that overlaps with the gate electrode, wherein an ion of the impurity with the one conductivity type is made to pass through the first conductive layer 104' and added to the semiconductor layer 102 positioned in the lower layer portion to form an one conductivity type impurity region 110 with a first concentration. In this case, an acceleration voltage of 50 kV or more is required depending on the film thicknesses of the second insulating film and the first conductive layer. The concentration of the impurity in the one conductivity type impurity region 110 with the first concentration is set from $1 \times 10^{16}$ to $5 \times 10^{18}$/cm$^3$ (peak value) on the premise of the LDD.

In the doping process for forming the source/drain region, the second conductive layer pattern 109 is used as a mask for shielding ions and an one conductivity type impurity region 111 with a second concentration is formed outside the one conductivity type impurity region 110 with the first concentration. In this case, the acceleration voltage is set at 30 kV or less. The concentration of the impurity in the one conductivity type impurity region 111 with the second concentration is set at $1 \times 10^{19}$ to $5 \times 10^{21}$/cm$^3$ (peak value). (FIG. 2(B))

After that, a third insulating film 112 using silicon nitride, a fourth insulating film 113 using an organic compound material of low-dielectric constant, and a wiring 114 are formed. (FIG. 1(C))

As described above, according to the present embodiment mode, it is possible to form an LDD overlapping with a gate electrode in a self-aligning manner and to form a TFT with the length (Lov) of 1 μm or more with the use of the gate electrode as a mask during ion doping. The length of the LDD region overlapping with the gate electrode is 1 μm or more to make a structure that is hard to degrade due to hot carriers.

EMBODIMENTS

Embodiment 1

In the present embodiment, an example of forming a gate electrode according to a process based on the embodiment mode will be described. The present embodiment will be described with reference to FIG. 1.

First, the first insulating layer 101 is formed of a silicon oxynitride film of 150 nm in thickness on the aluminosilicate-glass substrate with plasma CVD. The semiconductor layer 102 is formed of a crystalline silicon film for which an amorphous silicon film of 50 nm in thickness is crystallized by laser annealing so as to be isolated and separated into the shape of an island. As the second insulating film 103, a silicon oxynitride film of 115 nm in thickness is formed by plasma CVD with the use of $SiH_4$ and $N_2O$ as source gas. The first conductive layer 104 formed of tantalum nitride is made 30 nm in thickness, the second conductive layer 105 formed of titanium is made 320 nm in thickness, and the third conductive layer 106 formed of titanium nitride is formed to be a thickness of 50 nm. The mask pattern 107 is formed of a positive photoresist to be a thickness of 1.5 μm. Although the width of the mask pattern may be set appropriately, photolithographic processing is performed with mask patterns with 4.5 μm and 10 μm in the present embodiment (FIG. 1(A)).

Figure 5:
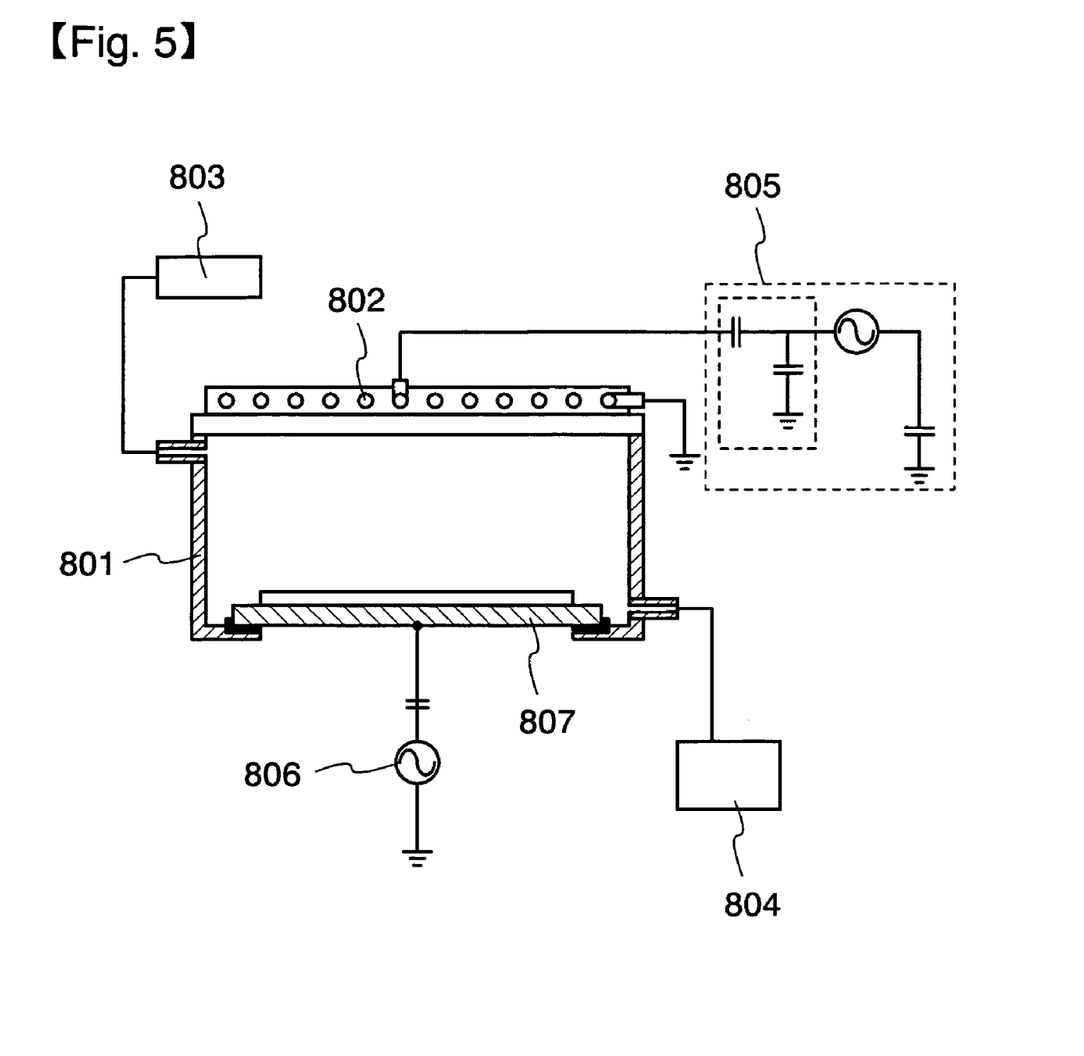
[FIG. 5] a diagram for describing a configuration of an ICP etching device.

Next, the second conductive layer (titanium) 105 and the third conductive layer (titanium nitride) 106 are etched by dry etching. For etching, an ICP etching system is used. FIG. 5 shows the configuration of the ICP etching system. A reaction chamber 801 is connected to a gas supply means 803 for etching and an exhaust means 804 for maintaining reduced pressure in the reaction chamber 801. A plasma generation means comprising a spiral coil 802 for inductively coupling to the reaction chamber 801 through a quartz plate and a high-frequency (13.56 MHz) power supply means 805. The application of bias voltage to the substrate side is conducted by a high-frequency (13.56 MHz) power supply means 806 to generate self-bias to a stage with the substrate thereon. For the etching process, the kind of etching gas to be supplied, high-frequency power supplied from each of the high-frequency (13.56 MHz) power supply means 806 and 807, and etching pressure are main parameters.

For the etching process in FIG. 1(B), gas of $CF_4$, $Cl_2$, and $O_2$ is used as etching gas. The etching pressure is set at 1.3 Pa, and each of 500 W of power for generating plasma and 300 W of power for biasing the substrate is supplied. Subsequently, as shown in FIG. 1(C), the etching gas is changed to $CF_4$ and $Cl_2$ to etch tantalum nitride that is the first conductive layer. The etching condition in this case, each of 1.5 Pa of etching pressure, 500 W of power for generating plasma, and 10 W of power for biasing the substrate is supplied. In this way, the first conductive layer pattern 108 can be formed.

After that, an argon plasma treatment is performed to remove or reduce a reaction product (TiOx) adhering to a taper sidewall portion of the first conductive layer pattern 108, which is considered a stopper film. In the argon plasma treatment, the ICP etching system is used as well, argon is supplied at 150 sccm, and each of 450 W of power for generating plasma and 100 W of power for biasing the substrate is supplied under a pressure of 2.0 Pa to perform the treatment for 30 sec.

Figure 06:
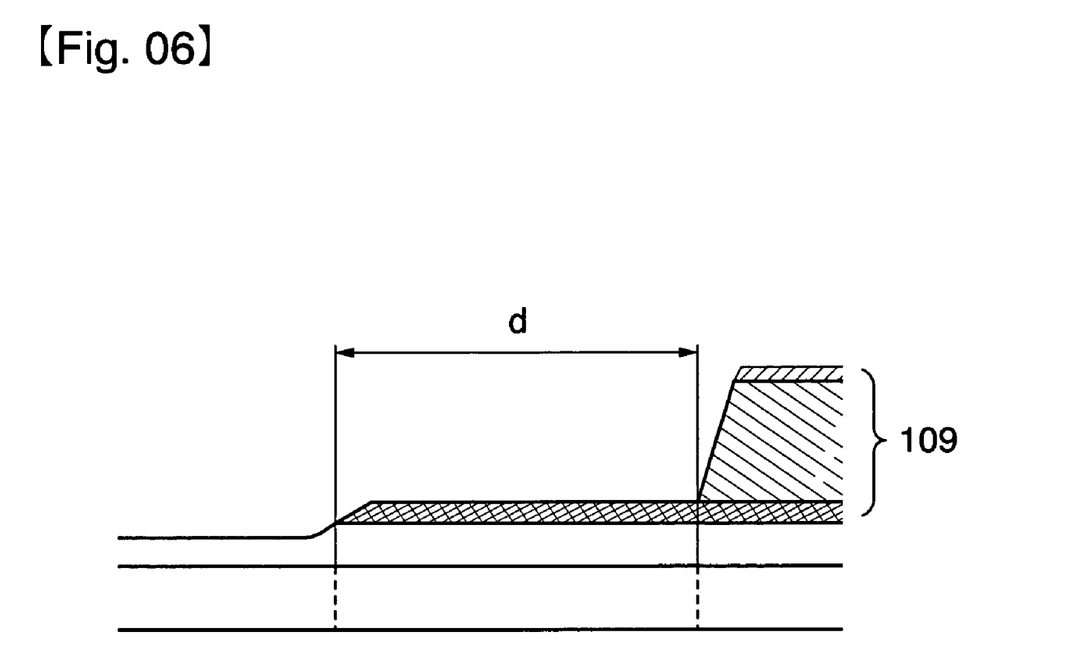
[FIG. 6] a diagram for describing the relation between a recess width d of a second conductive layer and a length of Lov of a gate overlapping TFT

Next, anisotropic etching is performed with the use of $BCl_3$, $Cl_2$, and $O_2$ as etching gas to process mainly the second conductive layer 105'. The etching pressure is set at 1.9 Pa, and each of 500 W of power for generating plasma and 10 W of power for biasing the substrate is supplied. The edge of the second conductive layer 105' is recessed inward from the edge of the first conductive layer 104'. In this way, the second conductive layer pattern 109 is formed, which becomes a gate electrode at a portion intersecting with the semiconductor layer 102. The recess width from the edge of the first conductive layer 104' can be made 1 μm or more. As shown in FIG. 6, the recess width d becomes a length that determines the length of Lov.

Figure 7:
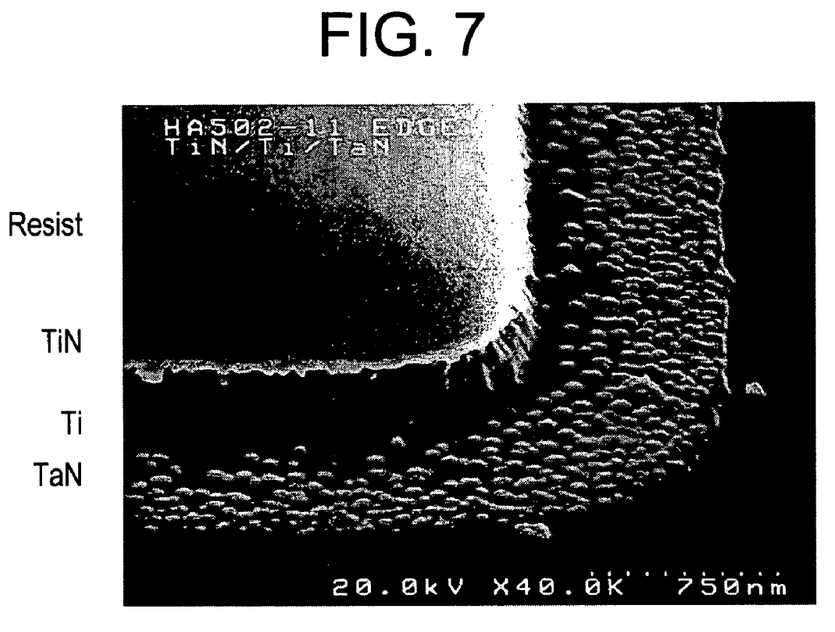
[FIG. 7] an SEM image in viewing at an angle a shape of a conductive layer pattern subjected to an etching process in accordance with Embodiment 1.
Figure 8:
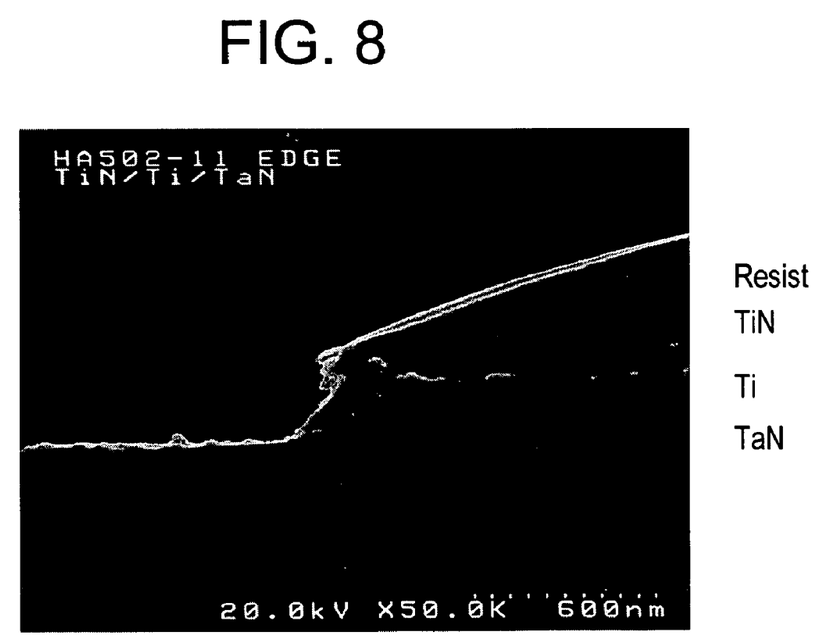
[FIG. 8] an SEM image showing a sectional shape of a conductive layer pattern subjected to an etching process in accordance with Embodiment 1.

FIGS. 7 and 8 are images through scanning electron microscopy (SEM), showing typical processed shapes in the case of performing an argon plasma treatment and an anisotropic etching process after a taper process, which each shows a state in which a tantalum nitride layer, a titanium layer, a titanium nitride layer, and resist that is a mask material are laminated from the bottom layer. Although the diagrams show the SEM images observed at an angle and from a section, a recess width of the titanium layer or a projecting width of the titanium nitride layer is estimated to be about 1.0 μm.

Thereafter, the one conductivity type impurity region 110 with the first concentration for forming the LDD is doped with phosphorous or boron at a concentration from $1\times10^{16}$ to $5\times10^{18}/cm^3$ (peak value) under an acceleration voltage of 50 kV by ion doping. (FIG. 2(A))

Besides, in the doping process for forming a source/drain region, the second conductive layer pattern 109 is used as a mask for shielding ions and the one conductivity type impurity region 111 with the second concentration is formed outside the one conductivity type impurity region 110 with the first concentration, in this case, at the acceleration voltage of 10 kV and the concentration of phosphorous or boron at $1\times10^{19}$ to $5\times10^{21}/cm^3$ (peak value). (FIG. 2(B))

After that, silicon oxynitride containing hydrogen is formed with plasma CVD to be a thickness of 100 nm, and photosensitive or non-photosensitive acrylic or polyimide resin is formed to be a thickness of 1 μm, thereby forming the fourth insulating film 113. Furthermore, the wiring 114 is formed according to need.

In this way, the LDD overlapping with the gate electrode can be formed in a self-aligning manner, and also, the TFT with the length (Lov) of 1 μm or more can be formed.

Embodiment 2

The present invention can apply to semiconductor devices in which various display screens are provided, and is useful particularly for large-screen semiconductor devices that have display screens more than 20 inches diagonally.

Figure 12:
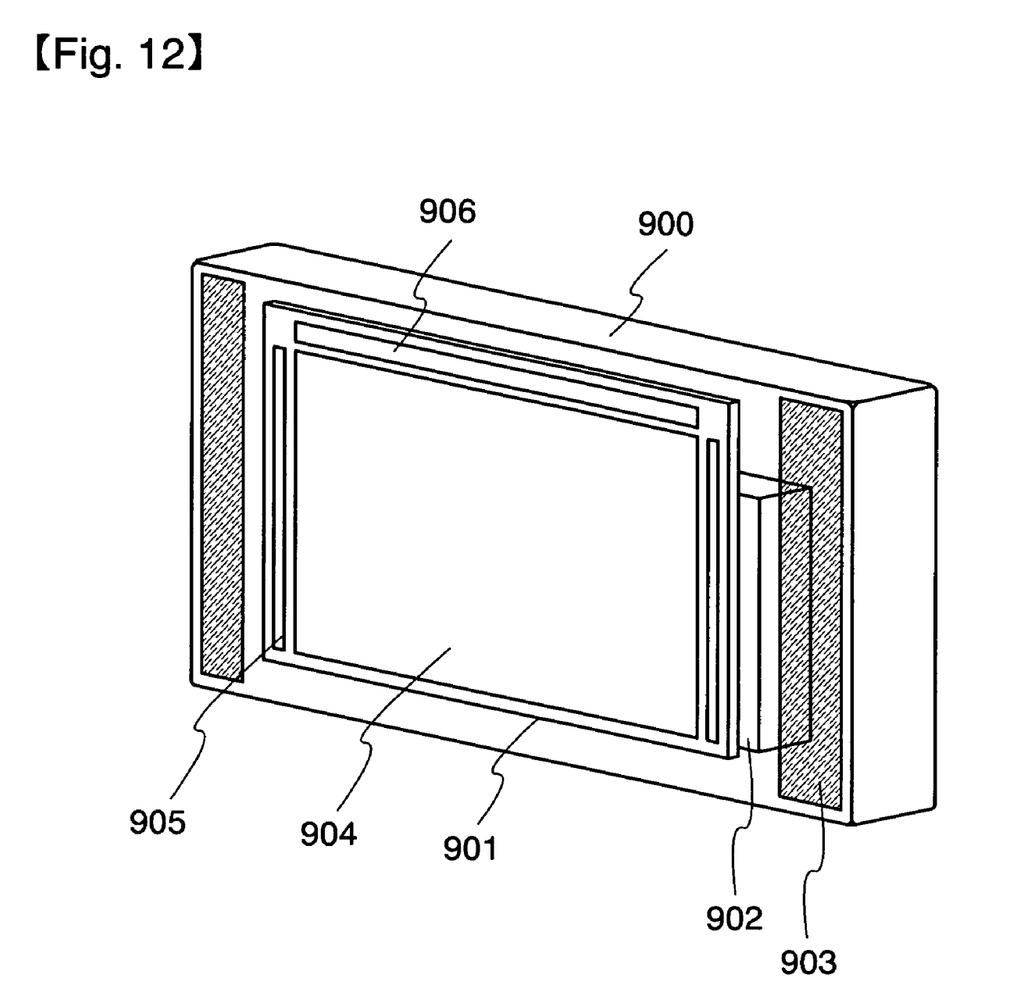
[FIG. 12] a diagram showing an example of a semiconductor device.

FIG. 12 is a structural example of a semiconductor device that has a display panel 901 mounted in a casing 900, which is applicable to television receivers and monitor systems of computers. In the casing 900, an electronic circuit board 902 and a speaker 903 for sound reproduction are loaded, wherein the electronic circuit board 902 incorporates an amplifier and a high-frequency circuit formed of a semiconductor integrated circuit, and a semiconductor memory or a magnetic memory such as a hard disk as a memory function to fulfill a function of displaying an image.

A display panel 901 can be composed of a driver-integrated type in which an active matrix pixel circuit 904 in which gate overlapping TFTs according to the present invention are used to arrange the TFT in a matrix shape, a scanning line driving circuit 905, and a data line driving circuit 906 are formed integrally.

Figure 11:
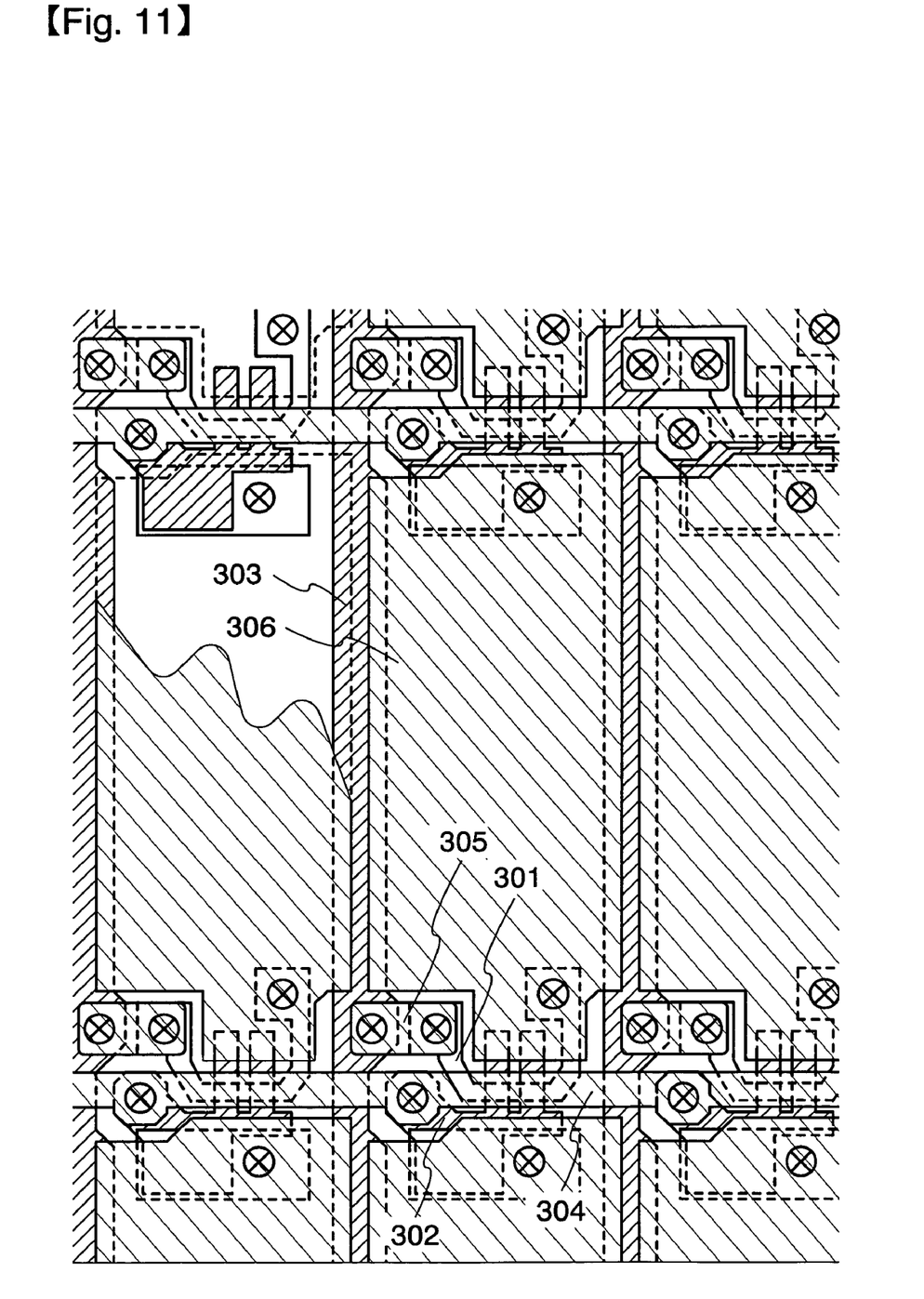
[FIG. 11] a top view showing active-matrix type pixels of a semiconductor device according to the present invention.

FIG. 11 is a diagram showing a principal structure of the active matrix pixel circuit 904. A gate electrode 302 intersecting with a semiconductor layer 301 and a data signal line 303 are formed of the same layer, that is, which is formed of a laminate including at least a conductive layer including titanium as its main component, and an etching process for forming the gate electrode or the wiring pattern is performed according to Embodiment 1. In this manner, it is possible to form a gate overlapping TFT that has Lov with a length of 1 μm or more, and also, resistance of the data signal line can be lowered. A gate signal line 304 is formed in the above thereof with an interlayer insulating film interposed therebetween and has a structure in contact with the gate electrode 302 through a contact hole. Of course, this wiring can be formed of titanium and aluminum, and it is possible to realize lowering resistance of the wiring. It is also possible to form a wiring 305 that connects the data signal line 303 and the semiconductor layer 301 of the same layer as the gate signal line 304. A pixel electrode 306 is formed with the use of ITO (indium tin oxide) that is a compound of indium oxide and titanium oxide. The details of such pixels are disclosed in Japanese Patent Laid-Open 2001-313397.

In the present embodiment, an example has been shown in the semiconductor device. However, the invention is not limited to the present embodiment and can be applied to various semiconductor devices. It is possible to be applied to various fields, for example, in addition to navigation systems, sound reproducing systems (such as car audio systems and component audio systems), notebook-sized personal computers, game machines, personal digital assistants (such as mobile computers, cellular phones, portable game machines, and electronic books), electrical home appliances such as refrigerators, washing machines, rice cookers, fixed telephones, vacuum cleaners, and clinical thermometers, railroad wall banners, and information displays such as arrival and departure guide plates in railroad stations and airports.

Although the embodiments according to the invention have been described as above, it is to be understood by those skilled in the art that various changes and modifications may be made without departing from the spirit and scope of the present invention.

EFFECT OF THE INVENTION

As described above, according to the present invention, in the process of forming a gate electrode of a laminate comprising a plurality of conductive layers to have a shape in which a width of a first conductive layer in the direction of a channel length is longer than that of a second conductive layer, the defect of a portion that is not etched (skirt shape) due to causing etch stop on the way is prevented from being left at an edge of the second conductive layer in an isotropic etching process by providing an argon plasma treatment for reducing or removing a reaction product after a taper etching process. As the result of no left portion that is not etched (skirt shape) at the edge of the second conductive layer, it is possible to make the length of the first conductive layer 1 μm or more in the direction of the channel length. The use of the gate electrode as a mask during ion doping allows the length of an LDD region overlapping with the gate electrode to be 1 μm or more and to increase the lifetime against degradation due to hot carriers.

According to the present invention, it is possible to form an LDD overlapping with a gate electrode in a self-aligning manner and to form a TFT with the length (Lov) of 1 μm or more with the use of the gate electrode as a mask during ion doping. The length of the LDD region overlapping with the gate electrode is 1 μm or more to enable increasing the lifetime of the TFT against degradation due to hot carriers.

What is claimed is:

1. A method of manufacturing a semiconductor device, comprising the steps of:
    forming a first conductive layer;
    forming a second conductive layer over and in contact with the first conductive layer;
    etching the second conductive layer;
    performing a plasma treatment to the first conductive layer and the second conductive layer after etching the second conductive layer; and
    etching a tapered portion of the second conductive layer after performing the plasma treatment to the first conductive layer and the second conductive layer.

2. The method according to claim 1, wherein the plasma treatment is an argon plasma treatment.

3. The method according to claim 1, wherein a reaction product adhering to the tapered portion of the second conductive layer is removed by the performing the plasma treatment step.

4. The method according to claim 1, wherein the first conductive layer is made of a metal nitride.

5. A method of manufacturing a semiconductor device, comprising the steps of:
    forming a first conductive layer;
    forming a second conductive layer including titanium as its main component over and in contact with the first conductive layer:
    etching the second conductive layer;
    performing a plasma treatment to the first conductive layer and the second conductive layer after etching the second conductive layer; and
    etching a tapered portion of the second conductive layer after performing the plasma treatment to the first conductive layer and the second conductive layer.

6. The method according to claim 5, wherein the plasma treatment is an argon plasma treatment.

7. The method according to claim 5, wherein a reaction product adhering to the tapered portion of the second conductive layer is removed by the performing the plasma treatment step.

8. The method according to claim 5, wherein the first conductive layer is made of metal nitride.

9. A method of manufacturing a semiconductor device, comprising the steps of:
    forming a first conductive layer;
    forming a second conductive layer over and in contact with the first conductive layer;
    forming a third conductive layer over and in contact with the second conductive layer;
    etching the second conductive layer after forming the third conductive layer:
    performing a plasma treatment to the first conductive layer, the second conductive layer and the third conductive layer; and etching a tapered portion of the second conductive layer after performing the plasma treatment to the first conductive layer, the second conductive layer and the third conductive layer.

10. The method according to claim 5, wherein the plasma treatment is an argon plasma treatment.

11. The method according to claim 5, wherein a reaction product adhering to the tapered portion of the second conductive layer is removed by the performing the plasma treatment step.

12. The method according to claim 5, wherein the first conductive layer is made of a metal nitride.

13. The method according to claim 5, wherein the third conductive layer is made of a metal having high-melting point.

14. A method of manufacturing a semiconductor device, comprising the steps of:
    forming a first conductive layer;
    forming a second conductive layer including titanium as its main component over and in contact with the first conductive layer;
    forming a third conductive layer over and in contact with the second conductive layer;
    etching the second conductive layer after forming the third conductive layer:
    performing a plasma treatment to the first conductive layer, the second conductive layer and the third conductive layer; and
    etching a tapered portion of the second conductive layer after performing the plasma treatment to the first conductive layer, the second conductive layer and the third conductive layer.

15. The method according to claim 14, wherein the plasma treatment is an argon plasma treatment.

16. The method according to claim 14, wherein a reaction product adhering to the tapered portion of the second conductive layer is removed by the performing the plasma treatment step.

17. The method according to claim 14, wherein the first conductive layer is made of a metal nitride.

18. The method according to claim 14, wherein the third conductive layer is made of a metal having high-melting point.

19. A method of manufacturing a semiconductor device, comprising the steps of:
    forming a semiconductor layer;
    forming an insulating film over the semiconductor layer;
    forming a first conductive layer over the insulating film;
    forming a second conductive layer over and in contact with the first conductive layer;
    etching the second conductive layer; performing a plasma treatment to the first conductive layer and the second conductive layer after etching the second conductive layer;
    etching a tapered portion of the second conductive layer after performing the plasma treatment to the first conductive layer and the second conductive layer; and
    adding an impurity elements to the semiconductor layer with the second conductive layer as a shielding mask to form a region with the impurity elements in the semiconductor film after etching the tapered portion of the second conductive layer,
    wherein the region with the impurity elements overlaps with the first conductive layer.

20. The method according to claim 19, wherein the plasma treatment is an argon plasma treatment.

21. The method according to claim 19, wherein a reaction product adhering to the tapered portion of the second conductive layer is removed by the performing the plasma treatment step.

22. The method according to claim 19, wherein the first conductive layer is made of a metal nitride.

23. A method of manufacturing a semiconductor device, comprising the steps of:
    forming a semiconductor layer;
    forming an insulating film over the semiconductor layer;
    forming a first conductive layer over the insulating film;
    forming a second conductive layer over and in contact with the first conductive layer;
    forming a third conductive layer over and in contact with the second conductive layer;
    etching the second conductive layer after forming the third conductive layer;
    performing a plasma treatment to the first conductive layer, the second conductive layer and the third conductive layer;
    etching a tapered portion of the second conductive layer after performing the plasma treatment to the first conductive layer, the second conductive layer and the third conductive layer; and
    adding an impurity elements to the semiconductor layer with the second conductive layer and the third conductive layer as a shielding mask to form a region with the impurity elements in the semiconductor film after etching the tapered portion of the second conductive layer,
    wherein the region with the impurity elements overlaps with the first conductive layer.

24. The method according to claim 23, wherein the plasma treatment is an argon plasma treatment.

25. The method according to claim 23, wherein a reaction product adhering to the tapered portion of the second conductive layer is removed by the performing the plasma treatment step.

26. The method according to claim 23, wherein the first conductive layer is made of a metal nitride.

27. The method according to claim 23, wherein the third conductive layer is made of a metal having high-melting point.

* * * * *